United States Patent
Tel et al.

(10) Patent No.: US 9,977,344 B2
(45) Date of Patent: May 22, 2018

(54) METROLOGY TARGET, METHOD AND APPARATUS, COMPUTER PROGRAM AND LITHOGRAPHIC SYSTEM

(71) Applicant: ASML Netherlands B.V., Veldhoven (NL)

(72) Inventors: Wim Tjibbo Tel, Helmond (NL); Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 15/358,321

(22) Filed: Nov. 22, 2016

(65) Prior Publication Data
US 2017/0153558 A1    Jun. 1, 2017

(30) Foreign Application Priority Data
Nov. 27, 2015    (EP) .................................... 15196854

(51) Int. Cl.
*G03F 7/20* (2006.01)
*G03F 9/00* (2006.01)

(52) U.S. Cl.
CPC ...... *G03F 7/70683* (2013.01); *G03F 7/70625* (2013.01); *G03F 7/70633* (2013.01); *G03F 7/70641* (2013.01); *G03F 9/7026* (2013.01)

(58) Field of Classification Search
CPC ............ G03F 7/70633; G03F 7/70625; G03F 7/70641; G03F 7/70683; G03F 9/7026
See application file for complete search history.

(56) References Cited

U.S. PATENT DOCUMENTS

| 6,536,130 B1 | 3/2003 | Wu et al. |
| 7,678,516 B2 | 3/2010 | Monahan et al. |

(Continued)

FOREIGN PATENT DOCUMENTS

| EP | 1 400 855 A2 | 3/2004 |
| NL | 2 013 737 A | 5/2015 |

(Continued)

OTHER PUBLICATIONS

"Combined overlay and focus-dose target," Research Disclosure, ISSN 0374-4353, 2009; 3 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

Disclosed is a substrate comprising a combined target for measurement of overlay and focus. The target comprises: a first layer comprising a first periodic structure; and a second layer comprising a second periodic structure overlaying the first periodic structure. The target has structural asymmetry which comprises a structural asymmetry component resultant from unintentional mismatch between the first periodic structure and the second periodic structure, a structural asymmetry component resultant from an intentional positional offset between the first periodic structure and the second periodic structure and a focus dependent structural asymmetry component which is dependent upon a focus setting during exposure of said combined target on said substrate. Also disclosed is a method for forming such a target, and associated lithographic and metrology apparatuses.

18 Claims, 6 Drawing Sheets

(56) References Cited

U.S. PATENT DOCUMENTS

| | | |
|---|---|---|
| 2006/0274310 A1 | 12/2006 | Kandel et al. |
| 2011/0027704 A1* | 2/2011 | Cramer ............... G03F 7/70641 |
| | | 430/30 |
| 2011/0043791 A1 | 2/2011 | Smilde et al. |
| 2011/0249247 A1 | 10/2011 | Cramer et al. |
| 2012/0242970 A1 | 9/2012 | Smilde et al. |
| 2013/0054186 A1 | 2/2013 | Den Boef |
| 2015/0085266 A1 | 3/2015 | Ausschnitt et al. |
| 2015/0338749 A1 | 11/2015 | Hinnen et al. |
| 2016/0291481 A1* | 10/2016 | Smilde ................ G03F 7/70633 |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2010/076232 A2 | 7/2010 |
| WO | WO 2011/012624 A1 | 2/2011 |
| WO | WO 2014/014906 A2 | 1/2014 |
| WO | WO 2015/090839 A1 | 6/2015 |
| WO | WO 2015078669 A1 * | 6/2015 ......... G03F 7/70633 |
| WO | WO 2015/120996 A1 | 8/2015 |

OTHER PUBLICATIONS

International Search Report and Written Opinion of the International Searching Authority directed to related International Patent Application No. PCT/EP2016/076835, dated Feb. 17, 2017; 12 pages.

* cited by examiner

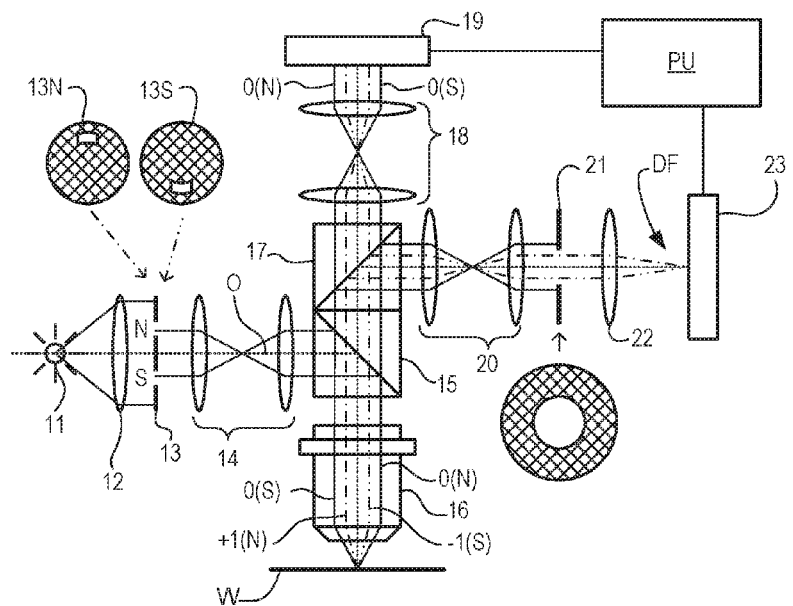
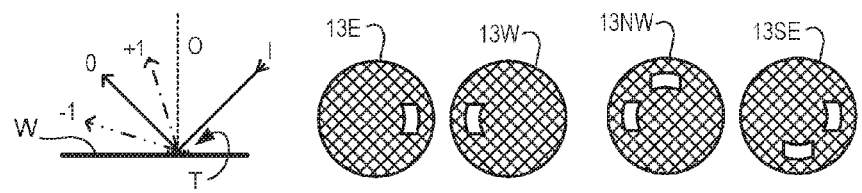
Fig. 3(a)
Fig. 3(b)  Fig. 3(c)  Fig. 3(d)
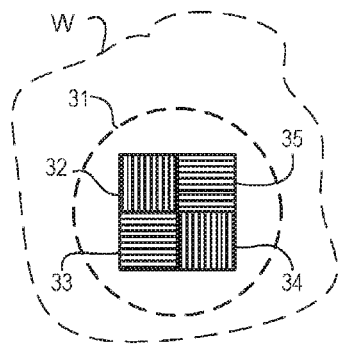
Fig. 4
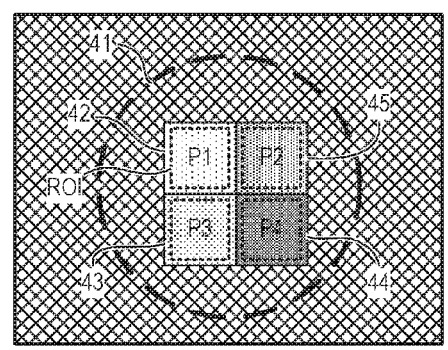
Fig. 5

METROLOGY TARGET, METHOD AND APPARATUS, COMPUTER PROGRAM AND LITHOGRAPHIC SYSTEM

BACKGROUND

Field of the Invention

The present invention relates to methods and apparatus for metrology usable, for example, in the manufacture of devices by lithographic techniques and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 µm by 40 µm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US20110027704A, US20110043791A and US20120242970A. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

In the known metrology technique, overlay measurement results are obtained by measuring an overlay target twice under certain conditions, while either rotating the overlay target or changing the illumination mode or imaging mode to obtain separately the $-1^{st}$ and the $+1^{st}$ diffraction order intensities. The intensity asymmetry, a comparison of these diffraction order intensities, for a given overlay target provides a measurement of target asymmetry, that is asymmetry in the target. This asymmetry in the overlay target can be used as an indicator of overlay error (undesired misalignment of two layers).

Other known metrology techniques enable measurement of focus from focus targets. Such techniques may comprise exposing structures which take a form which varies through focus. When the structures are subsequently measured, the focus used to expose them can be inferred from their form.

However, the target requirements for overlay and focus measurements are different, and therefore separate overlay and focus targets need to be exposed, and then separately measured.

SUMMARY OF THE INVENTION

The invention in a first aspect provides a substrate comprising a combined target for measurement of overlay and focus, said target comprising: a first layer comprising a first periodic structure; and a second layer comprising a second periodic structure overlaying the first periodic structure; wherein the target comprises structural asymmetry, said structural asymmetry comprising a structural asymmetry component resultant from unintentional mismatch between the first periodic structure and the second periodic structure, a structural asymmetry component resultant from an intentional positional offset between the first periodic structure and the second periodic structure and a focus dependent structural asymmetry component which is dependent upon a focus setting during exposure of said combined target on said substrate.

The invention in a further aspect provides a method of forming a combined target, said method comprising: exposing a first periodic structure in a first layer on a substrate; second periodic structure overlaying the first periodic structure in a second layer on the substrate; wherein the second periodic structure is overlaid the first periodic structure with an intentional positional offset between the first periodic structure and the second periodic structure; and said second periodic structure is exposed from a pattern which results in a focus dependent structural asymmetry in an exposed resist structure.

The invention further provides a computer program comprising processor readable instructions which, when run on suitable processor controlled apparatus, cause the processor controlled apparatus to perform the method of the first aspect or the second aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3(a)-3(d) comprises 3(a) a schematic diagram of a dark field scatterometer for use in measuring targets using a first pair of illumination apertures, 3(b) a detail of diffraction spectrum of a target grating for a given direction of illumination 3(c) a second pair of illumination apertures providing further illumination modes in using the scatterometer for diffraction based overlay measurements and 3(d) a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

DETAILED DESCRIPTION OF EXEMPLARY EMBODIMENTS

Before describing embodiments of the invention in detail, it is instructive to present an example environment in which embodiments of the present invention may be implemented.

Figure 1:
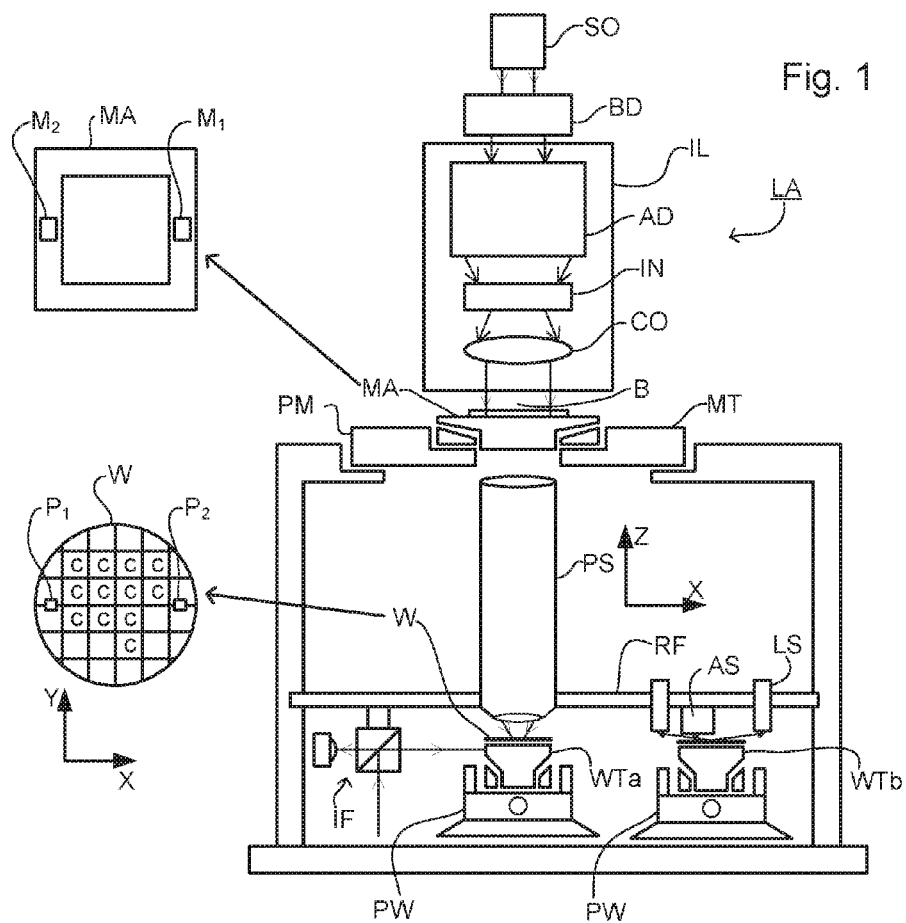
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
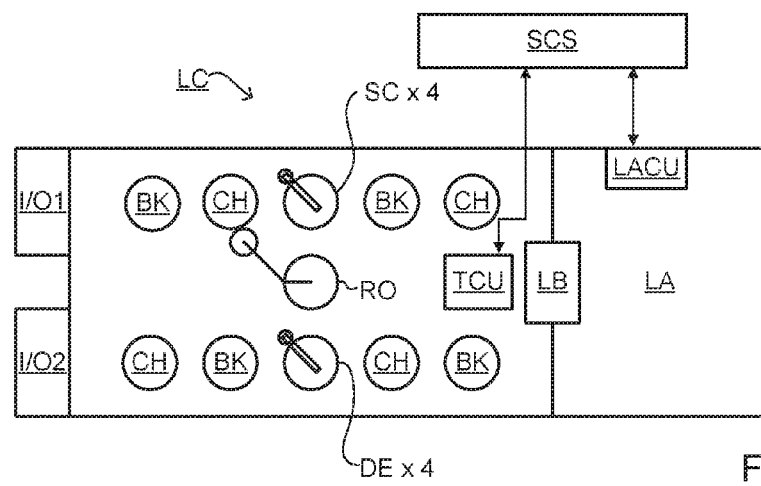
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 3) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts an overlay target or composite overlay target formed on a substrate according to known practice. The overlay target in this example comprises four sub-overlay targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensors 19 and 23. In an example dedicated to measurement of overlay, gratings 32 to 35 are themselves composite gratings formed by overlying gratings that are patterned in different layers of the semi-conductor device formed on substrate W. Gratings 32 to 35 may have differently biased overlay offsets in order to facilitate measurement of overlay between the layers in which the different parts of the composite gratings are formed. The meaning of overlay bias will be explained below with reference to FIG. 7. Gratings 32 to 35 may also differ in their orientation, as shown, so as to diffract incoming radiation in X and Y directions. In one example, gratings 32 and 34 are X-direction gratings with biases of the +d, −d, respectively. Gratings 33 and 35 are Y-direction gratings with offsets +d and −d respectively. Separate images of these gratings can be identified in the image captured by sensor 23. This is only one example of an overlay target. An overlay target may comprise more or fewer than 4 gratings, or only a single grating.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small overlay target gratings 32 to 35. If the overlay targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Figure 6:
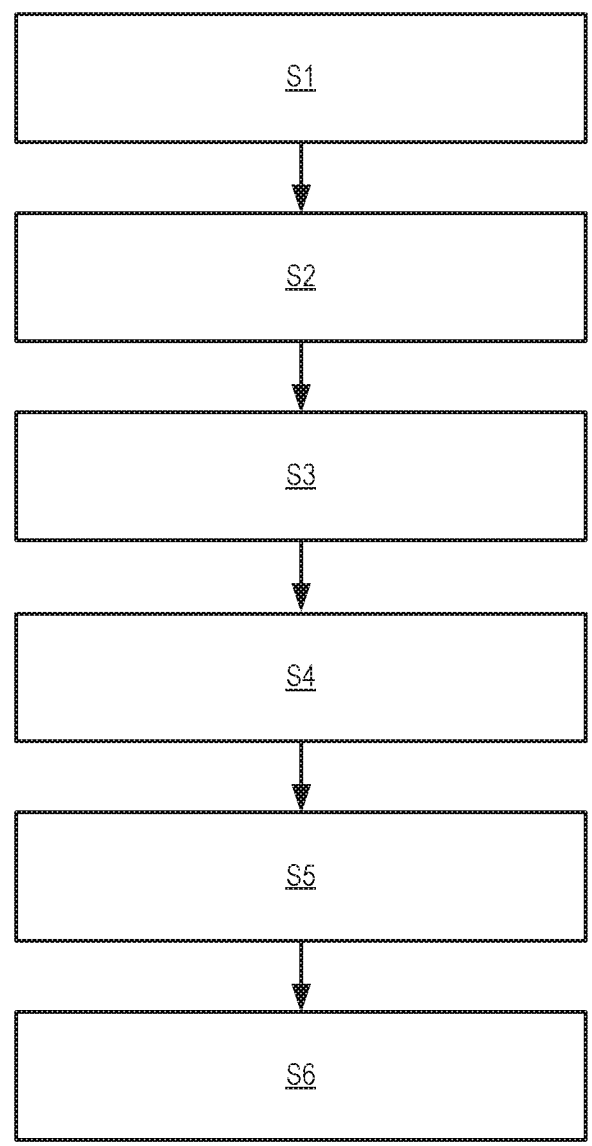
FIG. 6 is a flowchart showing the steps of an overlay measurement method using the scatterometer of FIG. 3 and adaptable to form embodiments of the present invention.

FIG. 6 illustrates how, using for example the method described in application WO 2011/012624, overlay error (i.e., undesired and unintentional overlay misalignment) between the two layers containing the component overlay targets 32 to 35 is measured. Such a method may be referred to a micro diffraction based overlay (µDBO). This measurement is done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry. At step S1, the substrate, for example a semiconductor wafer, is processed through a lithographic apparatus, such as the lithographic cell of FIG. 2, one or more times, to create an overlay target including the gratings 32-35. At S2, using the metrology apparatus of FIG. 3 or FIG. 9, an image of the overlay targets 32 to 35 is obtained using only one of the first order diffracted beams (say −1). At step S3, whether by changing the illumination mode, or changing the imaging mode, or by rotating substrate W by 180° in the field of view of the metrology apparatus, a second image of the overlay targets using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual overlay target lines of the overlay targets will not be resolved. Each overlay target will be represented simply by an area of a certain intensity level. In step S4, a region of interest (ROI) is identified within the image of each component overlay target, from which intensity levels will be measured.

Having identified the ROI for each individual overlay target and measured its intensity, the asymmetry of the overlay target, and hence overlay error, can then be determined. This is done (e.g., by the processor PU) in step S5 comparing the intensity values obtained for +1 and −1 orders for each overlay target 32-35 to identify their intensity asymmetry, e.g., any difference in their intensity. The term "difference" is not intended to refer only to subtraction. Differences may be calculated in ratio form. In step S6 the measured intensity asymmetries for a number of overlay targets are used, together with knowledge of any known imposed overlay biases of those overlay targets, to calculate one or more performance parameters of the lithographic process in the vicinity of the overlay target T. In the applications described herein, measurements using two or more different measurement recipes will be included. A performance parameter of great interest is overlay. As will be described later, the novel methods also allow other parameters of performance of the lithographic process to be calculated. These can be fed back for improvement of the lithographic process, and/or used to improve the measurement and calculation process of FIG. 6 itself.

In the prior applications, mentioned above, various techniques are disclosed for improving the quality of overlay measurements using the basic method mentioned above. These techniques will not be explained here in further detail. They may be used in combination with the techniques newly disclosed in the present application, which will now be described.

Figure 7A:
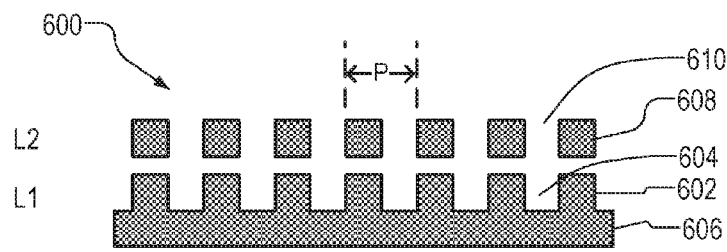
FIGS. 7(a)-7(c) show schematic cross-sections of overlay gratings having different overlay values in the region of zero.
Figure 7B:
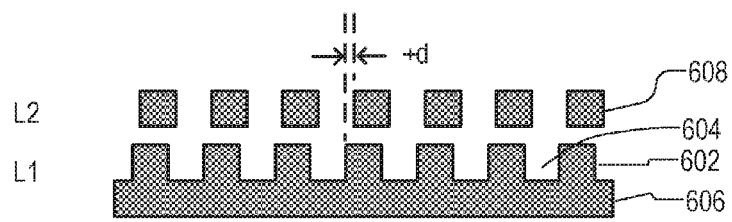
Figure 7C:
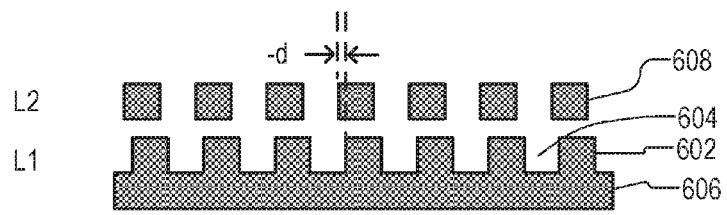

FIG. 7 shows schematic cross sections of overlay targets (overlay gratings), with different biases. These can be used as the overlay target T on substrate W, as seen in FIGS. 3 and 4. Gratings with periodicity in the X direction are shown for the sake of example only. Different combinations of these gratings with different biases and with different orientations can be provided separately or as part of a target.

Starting with FIG. 7(a) a target 600 formed in two layers, labeled L1 and L2, is shown. In the lowermost or bottom layer L1, a first structure (the lowermost or bottom structure), for example a grating, is formed by features 602 and spaces 604 on a substrate 606. In layer L2 a second structure, for example a grating, is formed by features 608 and spaces 610. (The cross-section is drawn such that the features 602, 608 (e.g., lines) extend into the page.) The grating pattern repeats with a pitch P in both layers. Features 602 and 608 may take the form of lines, dots, blocks and via holes. In the situation shown at (a), there is no overlay contribution due to misalignment, e.g., no overlay error and no imposed bias, so that each feature 608 lies exactly over a feature 602 in the first structure. Overlay targets may instead comprise interlaced top and bottom gratings such that each feature 608 may lie exactly over a space 604 (line-on-trench target as opposed to the illustrated line-on-line target).

At FIG. 7(b), the same overlay target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At (c) we see another feature with a second known imposed bias −d, such that the features of 608 are shifted to the left. Biased targets of this type shown at (a) to (c) are well known in the art, and used in the prior applications mentioned above. The principle is much the same for line-on-trench targets, with the offset being between (for example) features 608 relative to spaces 604.

In addition to measuring overlay, it is desirable to measure focus of the lithography beam on the substrate. One known method of determining the focus setting from a printed structure is by measuring the critical dimension (CD) of the printed structure. CD is a measure of the smallest feature (e.g., line width of an element). The printed structure may be a focus target, such as a line-space grating, formed specifically for focus monitoring. It is known that CD usually displays $2^{nd}$ order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus due to the parabolic shape of the curve. Another drawback is that the method is insensitive to the sign of any defocus as the curve is largely symmetrical around best focus.

To address these issues, diffraction based focus (DBF) was devised. Diffraction based focus may use focus target forming features on the reticle which print focus targets having a degree of asymmetry which is dependent on the focus setting during printing. This degree of asymmetry can then be measured using a scatterometery based inspection method, for example by measuring the intensity asymmetry between the intensities of $+1^{st}$ and $-1^{st}$ order radiation diffracted from the target, to obtain a measure of the focus setting.

Figure 8:
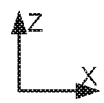
FIG. 8 illustrates target forming elements on a reticle suitable for forming a grating on a substrate having focus dependent asymmetry.
Figure 8:
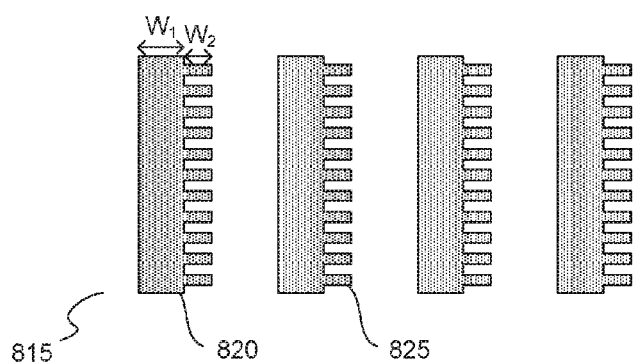

FIG. 8 illustrates DBF target forming design 815 configured for diffraction based focus measurements. It comprises plural DBF structures 820, each of which comprises high resolution substructures 825. The high resolution substructures 825 on top of a base pitch creates an asymmetric resist profile for each DBF structure 820, with the degree of asymmetry being dependent upon focus. Consequently a metrology tool can measure the degree of asymmetry from a target formed using DBF target forming design 815 and translate this into the scanner focus.

It is typical for substrates to have exposed thereon separate overlay targets and focus targets for measurement of overlay and focus. Additionally, separate targets for measurement of critical dimension may be required. These different types of targets each require separate measurement steps, each measurement step requiring its own positioning/alignment step beforehand. As a consequence, dense measurement of overlay and focus can take significant time, with a corresponding impact on productivity. Also, the area required on the substrate for the separate targets reduces the area available for the actual product. To mitigate these issues, it is common for there to be significantly fewer focus targets than overlay targets exposed and/or measured on a substrate, perhaps fewer than half the number of focus targets than overlay targets. However, this reduces accuracy of the focus measurements obtained, compared to if there were more measurement points available.

It is proposed herein to deliberately introduce a focus dependent structural asymmetry into an overlay type target as described above, such that the target can be used for simultaneous measurement of overlay and of focus. In particular the combined target will be able to be used to obtain simultaneous measurement of overlay and of focus using a single measurement radiation recipe (e.g., wavelength, angular distribution and polarization of the measurement radiation). Additionally, in an embodiment, critical dimension (CD) may also be measured from such a combined target.

Disclosed below is a combined target usable for simultaneous measurement of overlay and focus (and optionally CD). The combined target, according to one embodiment, may be designed to be measured after etching of the target. In another embodiment, the combined target may be designed to be measured after developing of the target (but before etching), i.e., in resist. In both cases the basic concept is to provide a compound target comprising a first grating overlaid with a second grating; with the first grating and/or the second grating being a dependent grating. Preferably, the first grating may be comprised in a first layer (bottom grating) and the focus dependent grating may be comprised in any subsequent layer. However, it is possible for the focus dependent grating to be implemented as the first grating in the first layer, exploiting the pattern shift after etch. It is also feasible that both the first and second gratings are focus dependent; for example, such that a focus difference can be determined between the two layers.

Reference to a focus dependent structure or grating is to be understood to mean deliberately induced focus dependence. There will of course always be some focus dependency in the formation of any feature (e.g. its profile will change as a function of focus), which is precisely why focus control is so important in lithographic processes.

The focus dependent grating may comprise any focus dependent grating which displays an asymmetric profile through focus. One possible candidate is the diffraction based focus target of FIG. 8. Other candidates include inter alfa any of those disclosed in WO2015/090839 and US2011249247, both of which are incorporated herein by reference. WO2015/090839, for example, discloses a target having alternating first and second structures, the first and second structures both comprise a low resolution substructure; and at least the second structure comprising one or more high resolution substructures, the number and/or size of high resolution substructures comprised in said first target having been determined by the focus of a patterned beam used to form the first target. In an embodiment, the each of the second structures may comprise a plurality of elongate high resolution substructures having different linewidths and arranged parallel to said low resolution substructure (e.g. in order of decreasing linewidth from said low resolution substructure). First substructures may comprise only a low resolution substructure or have high resolution substructures on the opposite side of the low resolution substructure compared to the second substructures. Other examples of focus dependent targets may be based on focus dependent side wall angle or resist loss. It should also be appreciated that the methods disclosed herein are suitable for targets made out of negative resist.

After Etch Measurement

Figure 9A:
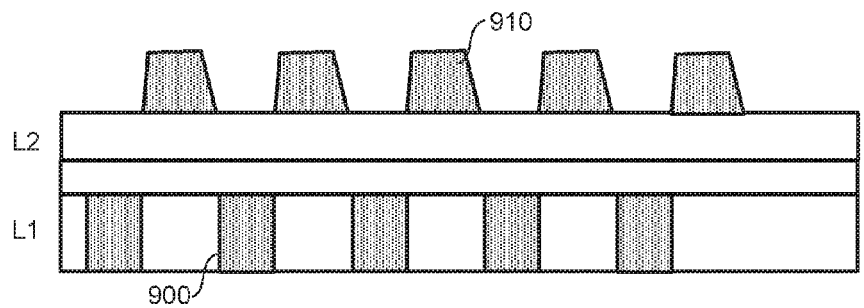
FIGS. 9(a)-9(c) show a target structure according to an embodiment of the invention 9(a) before etch and 9(b) after etch, illustrating the effect of pattern shift of an asymmetric resist profile after etching; and 9(c) shows a mirrored version of the target structure of FIG. 9(b)
Figure 9B:
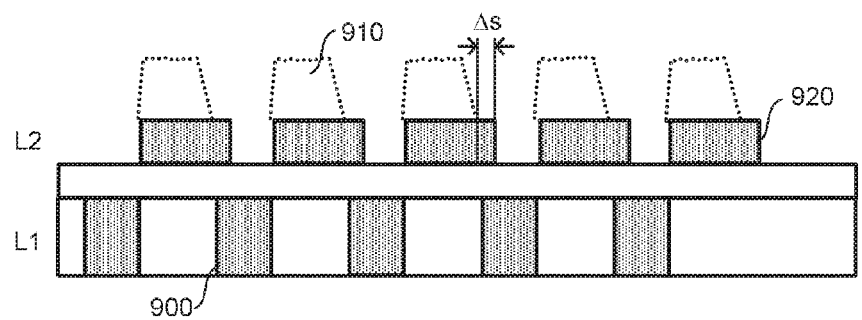
Figure 9C:
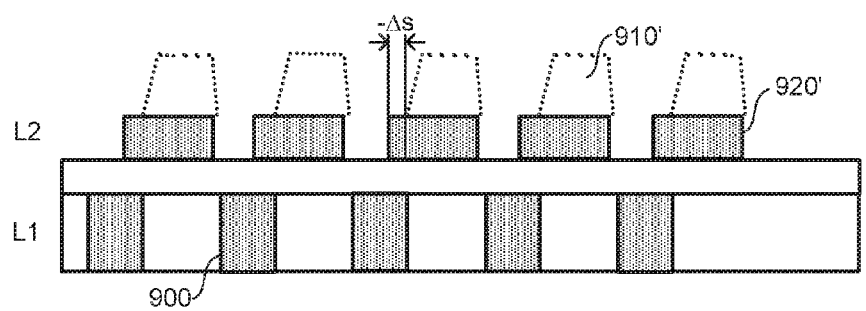

It is proposed that the combined target described herein be measured after performance of an etch step. This exploits the observation that any asymmetry in resist profile will cause a pattern shift following etching. The pattern shift can be seen to vary monotonically (e.g., linearly) with focus over a sufficient focal range. This is illustrated in FIG. 9, which shows a target structure (a) before etch and (b) after etch. In FIG. 9(*a*), the target structure comprises a bottom grating 900 in a first layer L1, a second layer L2 (or any subsequent layer) and asymmetric resist structures 910 defining a second grating. In FIG. 9(*b*), the resultant second grating 920 is shown, which has shifted by $\Delta s$ relative to the asymmetric resist structures 910 (shown dotted as they have been removed as part of the etching step), and therefore have shifted by $\Delta s$ relative to the bottom grating 900.

FIG. 9(*c*) shows that, for mirrored asymmetric resist structures 910' defining a second grating, the shift $-\Delta s$ of the resultant second grating 920' is equal in magnitude but opposite in direction to that of the (nominal) combined target in FIG. 9(*b*). This is exploited in separating the overlay and focus measurements from a combined target as taught herein.

This pattern shift is exploited in the combined target by forming the combined target using a resist structure with focus dependent asymmetry to form a second grating over a bottom grating. The focus dependent resist structure will therefore have an asymmetry which is dependent on focus. This asymmetry, after etching, will cause a shift in the position of the second grating relative to the bottom grating, or in other words a focus induced overlay shift. This focus induced overlay shift varies monotonically over a focal range sufficient for focus monitoring of a lithographic process. Therefore any measurement of asymmetry of such a target may comprise an asymmetry component resultant from the focus induced shift, an asymmetry component resultant from overlay error caused by unintentional misalignment of the layers and an asymmetry component resultant from a deliberate offset as used for standard overlay measurements, as described above. As such, the combined target may be used for measurement of overlay, by measurement of the asymmetry component resultant from overlay error, and for measurement of focus, by measurement of focus induced asymmetry component from which the focus used can be inferred. It should be noted that the combined target may be implemented as line-on-line targets or line-on-trench targets.

Methods of distinguishing the asymmetry component resultant from overlay error and the focus induced asymmetry component, so as to enable simultaneous measurement of both of these components, will be described below.

After Development Measurement

Figure 10A:
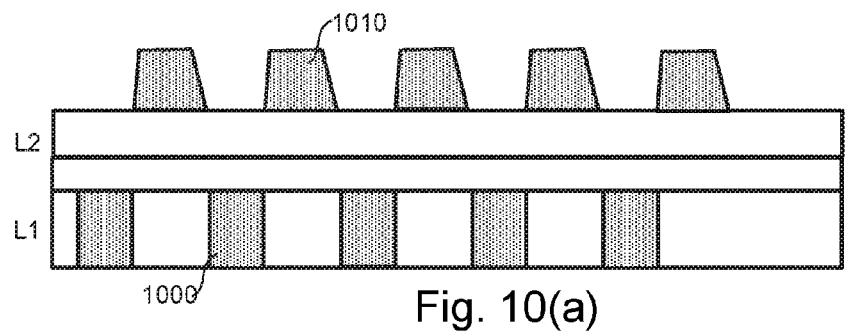
FIGS. 10(a)-10(b) show a 10(a) nominal and 10(b) mirrored target structure with asymmetric resist profile according to an embodiment of the invention.
Figure 10B:
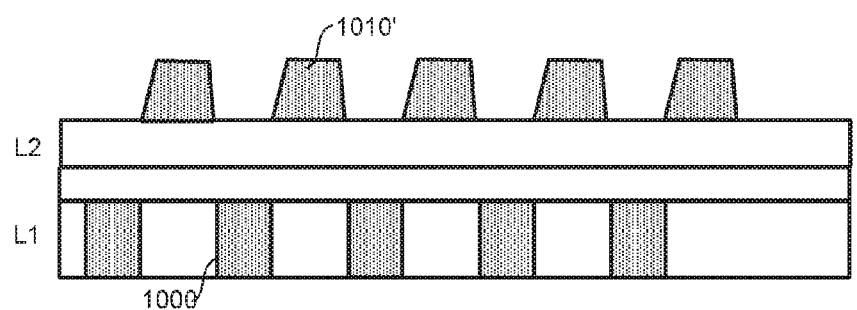

In some instances, it may be preferable to measure the combined target in resist, after development but before any etching step. FIG. 10 illustrates measurement of the combined target after development (but before etching) which enables simultaneous measurement of overlay and focus in resist. A resist profile, comprising asymmetric resist structures 1010 forming a second grating, is exposed over a bottom grating 1000 in a first layer L1, and is then developed. In this respect the structure shown in FIG. 10(*a*) is the same as that shown in FIG. 9(*a*). However, in this embodiment, the target is measured in this form.

It is well known that structural asymmetry in a target structure results in an asymmetry component additional to the overlay component in measurements of target asymmetry, such as measurements performed using the method of FIG. 6. As a consequence, many methods have been described to distinguish the overlay component from the structural asymmetry component, and/or to reduce the structural asymmetry present in the target. It is usually the case that this undesirable structural asymmetry is in the bottom grating, due to its method of manufacture, while gratings in subsequent layers can be made sufficiently symmetrical such that any asymmetry that is present may be ignored as not having a significant impact. However, asymmetry in subsequent layers also impacts overlay measurements by adding a structural asymmetry component to the measured asymmetry. This is exploited in this embodiment by deliberately introducing the focus dependent asymmetry to the asymmetric resist structures 1010 in the second (resist) grating. This introduces a focus induced asymmetry component to any asymmetry measurement of the combined target, in addition to the asymmetry component resultant from overlay error caused by unintentional misalignment of the layers and the asymmetry component resultant from a deliberate offset as used for standard overlay measurements. This focus induced asymmetry component is dependent on the side wall angles of the asymmetric resist structures 1010, and as such can be shown to vary monotonically through focus (over sufficient focus range).

FIG. 10(*b*) shows a mirrored version of the (nominal) combined target of FIG. 10(*a*), where the asymmetric resist structures 1010' are mirrored with respect to the target of FIG. 10(*a*). As the second grating is mirrored, its asymmetry is also mirrored. As a result of this, the focus induced asymmetry component of the nominal and mirrored targets will be is equal in magnitude but opposite in direction.

Distinguishing Overlay and Focus Measurements

Figure 11:
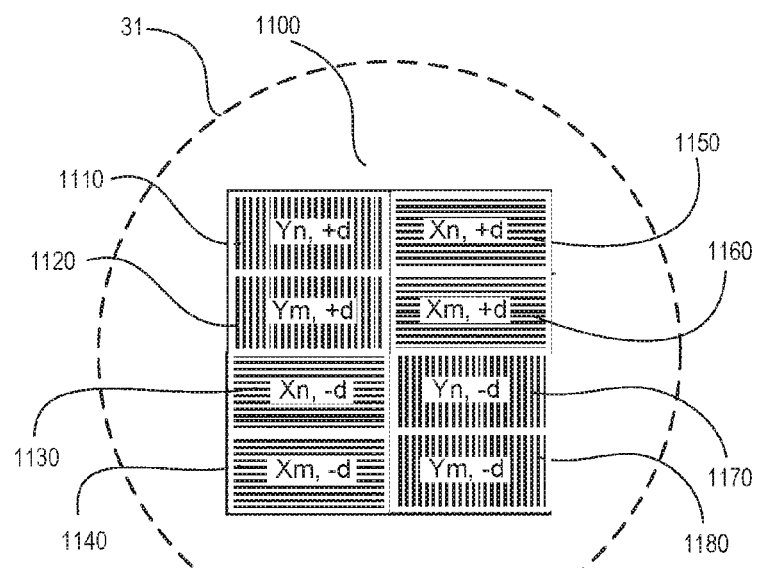
FIG. 11 shows a combined target according to an embodiment of the invention.

FIG. 11 shows a combined target 1100 for overlay and focus measurements. It comprises 8 different sub-targets 1110-1180 with different characteristics, 4 sub-targets with periodicity in each of the X-direction and Y-direction. Providing sub-targets in different directions is optional and a combined target with only 4 sub-targets with periodicity in only a single direction is envisaged. Also note that the specific order of arrangement of the sub-targets is largely arbitrary and can vary from that shown. The sub-targets do not necessarily need be arranged to form a square (or similar quadrilateral shape), although such an arrangement is advantageous in aiding simultaneous measurement with a measurement spot 32.

In the combined target 1100, each of the sub-targets 1110-1180 comprise a bottom grating overlaid with a second grating, the bottom grating and second grating comprising a structural asymmetry comprising a structural asymmetry component resultant from a deliberate offset between the positions of the bottom grating and second grating, a structural asymmetry component resultant from overlay error and a focus dependent structural asymmetry component. As such, each of the sub-targets 1110-1180 may be etched (as shown in FIGS. 9(*b*) and 9(*c*) or in resist (as shown in FIG. 10), as described above.

In the arrangement shown, for each direction of periodicity, there is a sub-target 1110, 1150 with a structural asymmetry component resultant from a first deliberate offset (+d) and a focus dependent structural asymmetry component in a first (nominal) direction n, a sub-target 1120, 1160 with a structural asymmetry component resultant from the first deliberate offset (+d) and a focus dependent structural asymmetry component in a second (mirrored) direction m, a sub-target 1130, 1170 with a structural asymmetry component resultant from a second deliberate offset (−d) and a focus dependent structural asymmetry component in the first (nominal) direction n, and a sub-target 1140, 1180 with a structural asymmetry component resultant from the second deliberate offset (−d) and the focus dependent structural asymmetry component in the second (mirrored) direction m.

Where the combined target 1100 is post-etch, the normal and mirrored sub-targets may comprise opposite and equal focus dependent pattern shifts of the second layer relative to the bottom layer and as illustrated in FIGS. 9(*b*) and 9(*c*). Where the combined target 1100 is pre etch (in resist), the normal and mirrored sub-targets may comprise sub-targets having nominal and mirrored resist profiles forming the second layer as illustrated in FIGS. 10(*a*) and 10(*b*). Due to the effect of the focus dependent asymmetry, it is not possible to simply impose first second deliberate offsets +d, −d that are equal in magnitude and opposite in direction, directly from reticle offsets (FIGS. 7(*b*) and 7(*c*)), as per known techniques in measuring overlay using biased targets. Therefore the deliberately imposed offsets cannot be assumed to be the offsets imposed on the reticle. As such a calibration should be performed to calibrate the deliberate offset values, as will be described below.

Each of the sub-targets 1110-1180 corresponds to a region of interest (ROI) in an image of the target obtained using a metrology apparatus such as illustrated in FIG. 3 (although the sub-targets 1110-1180 can also be measured separately). Different combinations of (e.g., intensity) measurements from each ROI enable separate determination of focus and/or overlay. For example, to perform an overlay measurement, determinations are made from the two ROIs (in a single direction) corresponding to the sub-targets having an imposed +d overlay offset component, which are then combined (e.g., averaged). Similarly determinations are made from the two ROIs (in the same direction) corresponding to the sub-targets having an imposed −d overlay offset component, which are also averaged. Using the specific arrangement shown, for the X-direction sub-targets, measurements from sub-target 1150 and sub-target 1160 are averaged and measurements from sub-target 1130 and sub-target 1140 are averaged. These averages are then treated the same as the measurements of conventional biased overlay gratings as described in FIG. 6. Consequently intensity asymmetry (intensity difference of corresponding higher orders of diffracted radiation) is calculated as a difference of these averages. As such, a first intensity asymmetry measurement comprises the difference of 1) the average of +1 order diffracted radiation from the targets 1150 and 1160 and 2) the average of −1 order diffracted radiation from the targets 1150 and 1160; and a second intensity asymmetry measurement comprises the difference of 3) the average of +1 order diffracted radiation from the targets 1130 and 1140 and 4) the average of −1 order diffracted radiation from the targets 1130 and 1140. These first and second intensity asymmetry measurements, along with knowledge of biases +d and −d, can be used to determine the structural asymmetry component resultant from overlay error, for example from a difference of these first and second intensity asymmetry measurements. A similar treatment can be performed for the Y-oriented sub-targets.

As explained previously, the nominal and mirrored gratings, which form part of the sub-segments, result in equal and opposite focus dependent structural asymmetry components in the respective sub-targets. Therefore, by performing overlay measurements using intensity measurements of sub-targets averaged over nominal and mirrored second gratings, the focus dependent structural asymmetry components are cancelled enabling the overlay error component to be calculated using known techniques.

To make focus measurements, it is the sub-targets having opposite imposed offsets +d and −d which are averaged per orientation, thereby cancelling out the asymmetry components resultant from the first second deliberate offsets +d, −d. Once again, intensity asymmetry (intensity difference of corresponding higher orders of diffracted radiation) is calculated as a difference of these averages.

For example, to perform a focus measurement, determinations are made from the two ROIs (in a single direction) corresponding to the sub-targets having a nominal second grating, which are then combined (e.g., averaged). Similarly determinations are made from the two ROIs (in a single direction) corresponding to the sub-targets having a mirrored second grating, which are also combined. Using the specific arrangement shown, for the X-direction sub-targets, measurements from sub-target 1150 and sub-target 1140 are averaged and measurements from sub-target 1130 and sub-target 1160 are averaged. Following this, a first intensity asymmetry measurement may comprise the difference of 1) the average of +1 order diffracted radiation from the targets 1150 and 1140 and 2) the average of −1 order diffracted radiation from the targets 1150 and 1140; and a second intensity asymmetry measurement may comprise the difference of 3) the average of +1 order diffracted radiation from the targets 1160 and 1130 and 4) the average of −1 order diffracted radiation from the targets 1160 and 1130. Either or both of these first and second intensity asymmetry measurements can be used to determine the focus dependent structural asymmetry component, from which the original focus used in forming the combined target can be inferred. A combination of the first and second intensity asymmetry measurements (e.g. a difference) may provide robustness against other causes of asymmetry in the target, e.g., odd aberrations. A similar treatment can be performed for the Y-oriented sub-targets. Clearly any focus measurement will yield a value for the focus setting during exposure of the layer comprising the focus dependent features only.

The combinations (e.g., averaging) can be made optically (combined regions of interest for the sub-targets being combined) or mathematically (mathematically combining intensities from separate regions of interest for each sub-target).

To summarize the separation of overlay and focus measurements for sub targets of the same orientation: overlay measurements are performed on averaged measurements of the sub-targets having the same imposed overlay offset but opposite focus induced asymmetry (nominal or mirrored second grating), and focus measurements are performed on averaged measurements of the sub-targets with the same focus induced asymmetry (nominal or mirrored second grating), but opposite imposed overlay offset.

Combined target 1100 in the example shown has sub targets in two orthogonal directions. A benefit of this is that focus can be measured in both of these directions (horizontal and vertical), when typically focus is only measured in one direction. This means that the overall focus measurement can be determined independently of astigmatism, i.e., it no longer needs be assumed that astigmatism drift/variation is zero.

Where possible, a combined target as disclosed may comprise other features to enable further measurements to be made. For example, to measure an error mismatch between coarser alignment grating features and product features (referred to herein as "mark print error"), an alignment target has been developed which allows the mark print error to be measured, and therefore corrected for. Such alignment targets may be referred to as differential sub-segmented targets (DSM targets) and are described in WO2014/014906 which is herein incorporated by reference. The combined targets described herein may also comprise smaller (at-resolution) substructures to enable measurement of the mark-space error.

In the above, when measuring overlay, the focus dependent asymmetry component is cancelled by averaging out measurements from nominal and mirrored sub-targets. However the bias shift is undefined. To have a properly defined imposed bias (+d and −d), the symmetry point of the focus dependent asymmetry between the nominal and mirrored sub-targets should be known. If this symmetry point is not known, a calibration step may be performed.

The calibration step, for overlay in a single direction, may comprise exposing a calibration substrate with a plurality of different offsets in that direction (e.g. offsets centered on 0 nm, and by way of specific example, between +20 nm and −20 nm). The calibration substrate is then measured to obtain measurements of overlay asymmetry and the relationship between offset and measured overlay asymmetry is determined. This can be done by plotting the offset against asymmetry and fitting a (for example) first or third order curve through the plotted data. The effective bias d can be obtained from the coefficients (e.g., slope) of the curve. This effective bias can be used in place of the imposed bias in the overlay measurements described above. The calibration substrate may comprise additional fields with offsets in the other orthogonal direction (i.e., the calibration substrate has fields with offsets in both X and Y). Fields with shifts in both directions are also envisaged, to calibrate any crosstalk that may be present.

In order to have an imposed bias near the intended value, an effective printed size (CD) is estimated for the second grating. Where the second grating is formed using structures such as those illustrated in FIG. 6, the effective CD may be estimated to be the sum of the width of the main structure and half the width of the high resolution sub structures 825 (i.e., $W_1 + 0.5\ W_2$).

The combined target described herein may be used to measure effective dose. Effective dose can then be used to infer CD, as once focus is known, it is effective dose that determines CD. Effective dose can be determined from the ROIs by combining (e.g., summing) the measurements from the four ROIs of the sub-targets of a particular orientation, and for both substrate orientations. This would allow measurement of effective dose from the target using only a single measurement recipe. As such, simultaneous measurement of overlay, focus and effective dose/CD is possible using the combined target described herein. CD can also be measured from the combined target via a reconstruction method, as is known in the art.

The arrangement of the sub-targets may be arranged differently to that illustrated, where all four quadrants are shown divided into sub-targets horizontally. For example, the sub-targets in two adjacent quadrants may have one quadrant divided into two sub-targets vertically and one quadrant divided into two sub-targets horizontally. This arrangement may be such that diagonal quadrants have the same orientation of division between the two sub targets. Alternatively, all four quadrants may be divided into sub-targets vertically.

The combined target as described herein provides significant benefit in set up time and substrate area requirements in process window optimization methods such as those disclosed in WO2015/120996, incorporated herein by reference. This document discloses a defect prediction method for a device manufacturing process involving processing a pattern onto a substrate, the method comprising: identifying a processing window limiting pattern (PWLP) from the pattern; determining a processing parameter under which the PWLP is processed; and determining or predicting, using the processing parameter, existence, probability of existence, a characteristic, or a combination thereof, of a defect produced from the PWLP with the device manufacturing process. To achieve this, multiple parameters, such as e.g., focus, overlay and/or CD need to be measured. The combined target allows these parameters to be measured using only a single measurement recipe and only a single target, therefore reducing the set up time and required substrate area for the target. Measurement time is also greatly reduced, as there is only the need for a single positioning step before measurement of focus and overlay (and possibly CD).

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the modified step S6 and so calculate overlay error or other parameters with reduced sensitivity to structural asymmetry.

The program may optionally be arranged to control the optical system, substrate support and the like to perform the steps S2-S5 for measurement of asymmetry on a suitable plurality of targets.

While the embodiments disclosed above are described in terms of diffraction based overlay measurements (e.g., measurements made using the second measurement branch of the apparatus shown in FIG. 3(*a*)), in principle the same models can be used for pupil based overlay measurements (e.g., measurements made using the first measurement branch of the apparatus shown in FIG. 3(*a*)). Consequently, it should be appreciated that the concepts described herein are equally applicable to diffraction based overlay measurements and pupil based overlay measurements.

Further embodiments according to the current invention are provided in below numbered clauses:

1. A substrate comprising a combined target for measurement of overlay and focus, said target comprising:
    a first layer comprising a first periodic structure; and
    a second layer comprising a second periodic structure overlaying the first periodic structure;
    wherein the target comprises structural asymmetry, said structural asymmetry comprising a structural asymmetry component resultant from unintentional mismatch between the first periodic structure and the second periodic structure, a structural asymmetry component resultant from an intentional positional offset between the first periodic structure and the second periodic structure and a focus dependent structural asymmetry component which is dependent upon a focus setting during exposure of said combined target on said substrate.

2. The substrate as claimed in claim 1 wherein said second periodic structure is comprised of a periodic resist structure on the substrate, said focus dependent structural asymmetry component resulting from asymmetry in the form of said periodic resist structure.

3. The substrate as claimed in claim 1 wherein said focus dependent structural asymmetry component results from a focus dependent positional offset of the second periodic structure relative to said first periodic structure, said focus dependent positional offset being a consequence of a positional shift in the second periodic structure after an etching step relative to an exposed periodic resist structure from which it is formed, said positional shift depending on a focus dependent asymmetry in said periodic resist structure.

4. The substrate as claimed in any preceding claim wherein said combined target is no larger than 20 µm in any dimension.

5. The substrate as claimed in any preceding claim wherein said combined target comprises at least a first set of four sub-targets, each comprising said structural asymmetry component resultant from unintentional mismatch between the first periodic structure and the second periodic structure, said four sub targets comprising:
    a first sub target comprising a first intentional positional offset between the first periodic structure and the second periodic structure and a first focus dependent structural asymmetry component;
    a second sub target comprising the first intentional positional offset between the first periodic structure and the second periodic structure and a second focus dependent structural asymmetry component, said second focus dependent structural asymmetry component being equal in magnitude and opposite in direction to said first focus dependent structural asymmetry component;
    a third sub target comprising a second intentional positional offset between the first periodic structure and the second periodic structure and said first focus dependent structural asymmetry component, said second intentional positional offset being equal in magnitude and opposite in direction to said first intentional positional offset; and
    a fourth sub target comprising said second intentional positional offset between the first periodic structure and the second periodic structure and said second focus dependent structural asymmetry component.

6. The substrate as claimed in claim 5 additionally comprising a second of said sets of four sub-targets, said first set of four sub-targets comprising sub-targets with their component periodic structures oriented orthogonally to the component periodic structures of said second set of four sub-targets.

7. The substrate as claimed in claim 5 or 6 wherein the second periodic structures of said sub targets comprising said first focus dependent structural asymmetry are formed from a nominal resist profile and the second periodic structures of said sub targets comprising said second focus dependent structural asymmetry are formed from a mirrored resist profile, said mirrored resist profile being mirrored relative to said nominal resist profile.

8. A method of measuring a combined target on a substrate as claimed in claim 5, 6 or 7, said method comprising:
determining said structural asymmetry component resultant from unintentional mismatch between the first periodic structure and the second periodic structure from a first combination of measurements of said first sub-target and said second sub-target and from a second combination of measurements of said third sub-target and said fourth sub target,
wherein said first combination of measurements and said second combination of measurements each cancel for said first focus dependent structural asymmetry component and said second focus dependent structural asymmetry component.

9. A method as claimed in claim 8 wherein each of said first combination of measurements and said second combination of measurements each comprise an average of said measurements.

10. A method as claimed in claim 8 or 9 comprising performing one or both of:
a determination of said first focus dependent structural asymmetry component from a third combination of measurements of said first sub-target and said fourth sub-target; and/or
a determination of said second focus dependent structural asymmetry component from a fourth combination of measurements of said second sub-target and said third sub-target,
wherein said third combination of measurements and said fourth combination of measurements each cancel for said first intentional positional offset between the first periodic structure and the second periodic structure and said second intentional positional offset between the first periodic structure and the second periodic structure.

11. A method as claimed in claim 10 wherein each of said third combination of measurements and said fourth combination of measurements each comprise an average of said measurements.

12. A method as claimed in claim 10 or 11 comprising determining a focus value representing a focus setting during exposure of one of said first layer or second layer of said combined target from said determination of said first focus dependent structural asymmetry component and/or said determination of said second focus dependent structural asymmetry component.

13. A method as claimed in claim 10, 11 or 12 comprising:
simultaneously measuring all of said sub-targets; and
determining said structural asymmetry component resultant from unintentional mismatch between the first periodic structure and the second periodic structure and either or both of said first focus dependent structural asymmetry component and said second focus dependent structural asymmetry component from said simultaneous measurements of said sub-targets.

14. A method as claimed in any of claims 8 to 13 comprising the step of measuring critical dimension and/or effective dose from said combined target.

15. A method as claimed in claim 14 wherein measuring critical dimension and/or effective dose comprises summing measurements from each of said first sub-target, second sub-target, third, sub-target and fourth sub-target.

16. A method as claimed in claim 14 wherein measuring critical dimension is performed from a reconstruction of said combined target.

17. A method as claimed in any of claims 8 to 16 comprising performing an initial calibration step comprising to determine an effective positional offset resultant from a combination of the intentional positional offset and an additional offset component resultant from the symmetry point being undefined between nominal resist structures used to form said second periodic structure of said sub targets comprising said first focus dependent structural asymmetry and mirrored resist structures used to form said second periodic structure of said sub targets comprising said second focus dependent structural asymmetry.

18. A method as claimed in claim 17 wherein said initial calibration step comprises:
exposing a calibration substrate with a plurality of different positional offsets between a first layer and a second layer, in one or two orthogonal directions in the substrate plane, for different fields on said calibration substrate;
measuring the calibration substrate to obtain asymmetry measurements; and
determining the relationship between said positional offsets and said asymmetry measurements.

19. A method of forming a combined target, said method comprising:
exposing a first periodic structure in a first layer on a substrate;
second periodic structure overlaying the first periodic structure in a second layer on the substrate;
wherein the second periodic structure is overlaid the first periodic structure with an intentional positional offset between the first periodic structure and the second periodic structure; and
said second periodic structure is exposed from a pattern which results in a focus dependent structural asymmetry in an exposed resist structure.

20. A method as claimed in claim 19 comprising performing an etching step on said combined target, said etching step resulting in said second periodic structure undergoing a positional shift relative to the exposed resist structure, said positional shift being dependent on the structural asymmetry in said exposed resist structure.

21. A method as claimed in claim 19 or 20 wherein said combined target is no larger than 10 μm in any dimension.

22. A method as claimed in claim 19, 20 or 21 wherein said method comprises forming a plurality of sub-targets of which the combined target is comprised, said method comprising: forming a first sub target with a first intentional positional offset between the first periodic structure and the second periodic structure, the second periodic structure of the first sub target being exposed from a pattern which results in a first focus dependent structural asymmetry in an exposed resist structure;
forming a second sub target with the first intentional positional offset between the first periodic structure and the second periodic structure, the second periodic structure of the second sub target being exposed from a pattern which results in a second focus dependent structural asymmetry in an exposed resist structure, said second focus dependent structural asymmetry being equal in magnitude and opposite in direction to said first focus dependent structural asymmetry;

forming a third sub target with a second intentional positional offset between the first periodic structure and the second periodic structure, the second periodic structure of the third sub target being exposed from a pattern which results in said first focus dependent structural asymmetry in an exposed resist structure, said second intentional positional offset being equal in magnitude and opposite in direction to said first intentional positional offset; and forming a fourth sub target with said second intentional positional offset between the first periodic structure and the second periodic structure, the fourth periodic structure of the third sub target being exposed from a pattern which results in said second focus dependent structural asymmetry in an exposed resist structure.

23. A method as claimed in claim 22 wherein the pattern from which the second periodic structures of the first sub-target and the third sub-target are exposed is mirrored relative to the pattern from which the second periodic structures of the second sub-target and the fourth sub-target are exposed.

24. A method as claimed in claim 22 or 23 wherein said forming a plurality of sub-targets comprises forming first and second sets of said first sub-target, second sub-target, third sub-target and fourth sub-target, said first set comprising sub-targets with their component periodic structures oriented orthogonally to the component periodic structures of said second set.

25. A method as claimed in any of claims 19 to 24 wherein the pattern used to expose said second periodic structures comprises periodic features, each of which comprise high resolution substructures, said high resolution substructures resulting in said focus dependent structural asymmetry in an exposed resist structure.

26. A method as claimed in claim 25 wherein each of said periodic features comprises said high resolution substructures along one edge of a main substructure of the periodic feature.

27. A lithographic apparatus comprising:
an illumination optical system arranged to illuminate a pattern;
a projection optical system arranged to project an image of the pattern onto a substrate;
wherein said lithographic apparatus is operable to perform the method of any of claims 19 to 26.

28. A metrology apparatus comprising:
an illumination system configured to illuminate with radiation a combined target produced using the lithographic process on the substrate;
a detection system configured to detect scattered radiation arising from illumination of the combined target;
wherein said metrology apparatus is operable to perform the method of any of claims 8 to 18.

29. A lithographic cell comprising the lithographic apparatus of claim 27 and the metrology apparatus of claim 28.

30. A computer program comprising processor readable instructions which, when run on suitable processor controlled apparatus, cause the processor controlled apparatus to perform the method of any one of claims 8 to 18.

31. A computer program comprising processor readable instructions which, when run on suitable processor controlled apparatus, cause the processor controlled apparatus to perform the method of any one of claims 19 to 26.

32. A computer program carrier comprising the computer program of claim 30 and/or the computer program of claim 31.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A substrate comprising a combined target for diffraction-based measurement of overlay and focus, said target comprising:
a first layer comprising a first periodic grating structure; and
a second layer comprising a second periodic grating structure overlaying the first periodic grating structure;
wherein the target comprises structural asymmetry, said structural asymmetry comprising a structural asymmetry component resultant from unintentional mismatch between the first periodic grating structure and the second periodic grating structure, a structural asymmetry component resultant from an intentional positional offset between the first periodic grating structure and the second periodic grating structure and a focus dependent structural asymmetry component which is dependent upon a focus setting during exposure of said combined target on said substrate.

2. The substrate of claim 1, wherein said combined target comprises at least a first set of four sub-targets, each comprising said structural asymmetry component resultant from unintentional mismatch between the first periodic grating structure and the second periodic grating structure, said four sub targets comprising:
a first sub target comprising a first intentional positional offset between the first periodic grating structure and the second periodic grating structure and a first focus dependent structural asymmetry component;
a second sub target comprising the first intentional positional offset between the first periodic grating structure and the second periodic grating structure and a second focus dependent structural asymmetry component, said second focus dependent structural asymmetry component being equal in magnitude and opposite in direction to said first focus dependent structural asymmetry component;
a third sub target comprising a second intentional positional offset between the first periodic grating structure and the second periodic grating structure and said first focus dependent structural asymmetry component, said second intentional positional offset being equal in magnitude and opposite in direction to said first intentional positional offset; and
a fourth sub target comprising said second intentional positional offset between the first periodic grating structure and the second periodic grating structure and said second focus dependent structural asymmetry component.

3. The substrate of claim 2, additionally comprising a second of said sets of four sub-targets, said first set of four sub-targets comprising sub-targets with their component periodic grating structures oriented orthogonally to the component periodic grating structures of said second set of four sub-targets.

4. The substrate of claim 2, wherein the second periodic grating structures of said sub targets comprising said first focus dependent structural asymmetry are formed from a nominal resist profile and the second periodic grating structures of said sub targets comprising said second focus dependent structural asymmetry are formed from a mirrored resist profile, said mirrored resist profile being mirrored relative to said nominal resist profile.

5. A method of measuring a combined target on a substrate of claim 2, said method comprising:
determining said structural asymmetry component resultant from unintentional mismatch between the first periodic grating structure and the second periodic grating structure from a first combination of measurements of said first sub-target and said second sub-target and from a second combination of measurements of said third sub-target and said fourth sub target,
wherein said first combination of measurements and said second combination of measurements each cancel for said first focus dependent structural asymmetry component and said second focus dependent structural asymmetry component.

6. The method of claim 5, wherein each of said first combination of measurements and said second combination of measurements each comprise an average of said measurements.

7. The method of claim 5, comprising performing one or both of:

a determination of said first focus dependent structural asymmetry component from a third combination of measurements of said first sub-target and said fourth sub-target; and/or
a determination of said second focus dependent structural asymmetry component from a fourth combination of measurements of said second sub-target and said third sub-target,
wherein said third combination of measurements and said fourth combination of measurements each cancel for said first intentional positional offset between the first periodic grating structure and the second periodic grating structure and said second intentional positional offset between the first periodic grating structure and the second periodic grating structure.

8. The method of claim 7, comprising determining a focus value representing a focus setting during exposure of one of said first layer or second layer of said combined target from said determination of said first focus dependent structural asymmetry component and/or said determination of said second focus dependent structural asymmetry component.

9. The method of claim 7, comprising:
simultaneously measuring all of said sub-targets; and
determining said structural asymmetry component resultant from unintentional mismatch between the first periodic grating structure and the second periodic grating structure and either or both of said first focus dependent structural asymmetry component and said second focus dependent structural asymmetry component from said simultaneous measurements of said sub-targets.

10. The method of claim 5, comprising the step of measuring critical dimension and/or effective dose from said combined target.

11. The method of claim 5, comprising performing an initial calibration step to determine an effective positional offset resultant from a combination of the intentional positional offset and an additional offset component resultant from the symmetry point being undefined between nominal resist structures used to form said second periodic grating structure of said sub targets comprising said first focus dependent structural asymmetry and mirrored resist structures used to form said second periodic grating structure of said sub targets comprising said second focus dependent structural asymmetry.

12. A metrology apparatus comprising:
an illumination system configured to illuminate with radiation a combined target produced using the lithographic process on the substrate;
a detection system configured to detect scattered radiation arising from illumination of the combined target;
wherein said metrology apparatus is operable to perform the method of claim 5.

13. A non-transitory computer-readable medium comprising processor readable instructions which, when run on processor controlled apparatus, cause the processor controlled apparatus to perform the method of claim 5.

14. A method of forming a combined target, said method comprising:
exposing a first periodic grating structure in a first layer on a substrate;
exposing a second periodic grating structure overlaying the first periodic grating structure in a second layer on the substrate;
wherein the second periodic grating structure is overlaid the first periodic grating structure with an intentional positional offset between the first periodic grating structure and the second periodic grating structure; and said second periodic grating structure is exposed from a pattern which results in a focus dependent structural asymmetry in an exposed resist structure.

15. The method of claim 14, wherein said method comprises forming a plurality of sub-targets of which the combined target is comprised, said method comprising:

forming a first sub target with a first intentional positional offset between the first periodic grating structure and the second periodic grating structure, the second periodic grating structure of the first sub target being exposed from a pattern which results in a first focus dependent structural asymmetry in an exposed resist structure;

forming a second sub target with the first intentional positional offset between the first periodic grating structure and the second periodic grating structure, the second periodic grating structure of the second sub target being exposed from a pattern which results in a second focus dependent structural asymmetry in an exposed resist structure, said second focus dependent structural asymmetry being equal in magnitude and opposite in direction to said first focus dependent structural asymmetry;

forming a third sub target with a second intentional positional offset between the first periodic grating structure and the second periodic grating structure, the second periodic grating structure of the third sub target being exposed from a pattern which results in said first focus dependent structural asymmetry in an exposed resist structure, said second intentional positional offset being equal in magnitude and opposite in direction to said first intentional positional offset; and forming a fourth sub target with said second intentional positional offset between the first periodic grating structure and the second periodic grating structure, the fourth periodic grating structure of the third sub target being exposed from a pattern which results in said second focus dependent structural asymmetry in an exposed resist structure.

16. The method claim of 14, wherein the pattern used to expose said second periodic grating structures comprises periodic features, each of which comprise high resolution substructures, said high resolution substructures resulting in said focus dependent structural asymmetry in an exposed resist structure.

17. A lithographic apparatus comprising:
an illumination optical system arranged to illuminate a pattern;
a projection optical system arranged to project an image of the pattern onto a substrate;
wherein said lithographic apparatus is operable to perform the method of claim 14.

18. A non-transitory computer-readable medium comprising processor readable instructions which, when run on processor controlled apparatus, cause the processor controlled apparatus to perform the method of claim 14.

* * * * *